United States Patent
Ohsaki et al.

(10) Patent No.: US 6,664,641 B2
(45) Date of Patent: Dec. 16, 2003

(54) WIRING STRUCTURE FOR AN INTEGRATED CIRCUIT

(75) Inventors: Akihiko Ohsaki, Tokyo (JP); Masahiko Fujisawa, Tokyo (JP); Noboru Morimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/261,653

(22) Filed: Oct. 2, 2002

(65) Prior Publication Data

US 2003/0189224 A1 Oct. 9, 2003

(30) Foreign Application Priority Data

Apr. 8, 2002 (JP) .......................... 2002-105112

(51) Int. Cl.[7] .................. H01L 27/10; H01L 23/48
(52) U.S. Cl. ............... 257/774; 257/211; 257/207; 257/208; 257/209; 257/758; 257/773; 257/776
(58) Field of Search ................ 257/211, 758, 257/207, 774, 751, 763, 760, 701, 208, 209, 210, 773, 776, 923; 438/241, 266, 239, 243, 253, 466, 629, 637, 640, 667, 668

(56) References Cited

U.S. PATENT DOCUMENTS 5,223,733 A * 6/1993 Doi et al. ................. 257/386
6,396,150 B2 * 5/2002 Kohno ..................... 257/758
6,531,357 B2 * 3/2003 Takeuchi et al. ........... 438/241

FOREIGN PATENT DOCUMENTS

JP        11-274154      10/1999

* cited by examiner

Primary Examiner—Minh Loan Tran
Assistant Examiner—Tan Tran
(74) Attorney, Agent, or Firm—Oblon, Spivak, McClelland, Maier & Neustadt, P.C.

(57) ABSTRACT

A wire width and a wiring space of each of signal wires 1 and ground/power wires 2 are determined to be a wire width W1 (the minimum wire width) and a wiring space S1, respectively. A wire width and a wiring space of the via-hole neighboring region 1a or 2a are determined to be a wire width W2 (>W1) and a wiring space S2 (<S1), respectively. The wire widths W1 and W2 and the wiring spaces S1 and S2 are respectively determined so as to maintain the minimum wiring pitch P. The wiring space S1 is determined also so as to satisfy $\{S1/P \geq 0.6\}$. Further, the signal wires 1 and the ground/power wires 2 have the same wire thickness of a wire thickness T1 which allows an aspect ratio (T1/W1) to be equal to, or higher than, 2.

5 Claims, 9 Drawing Sheets

F I G. 8
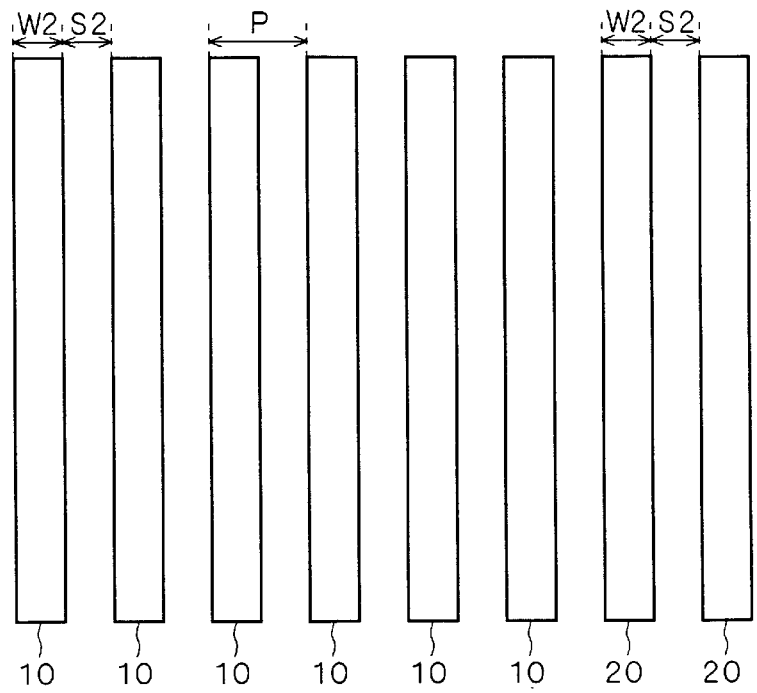
F I G. 9
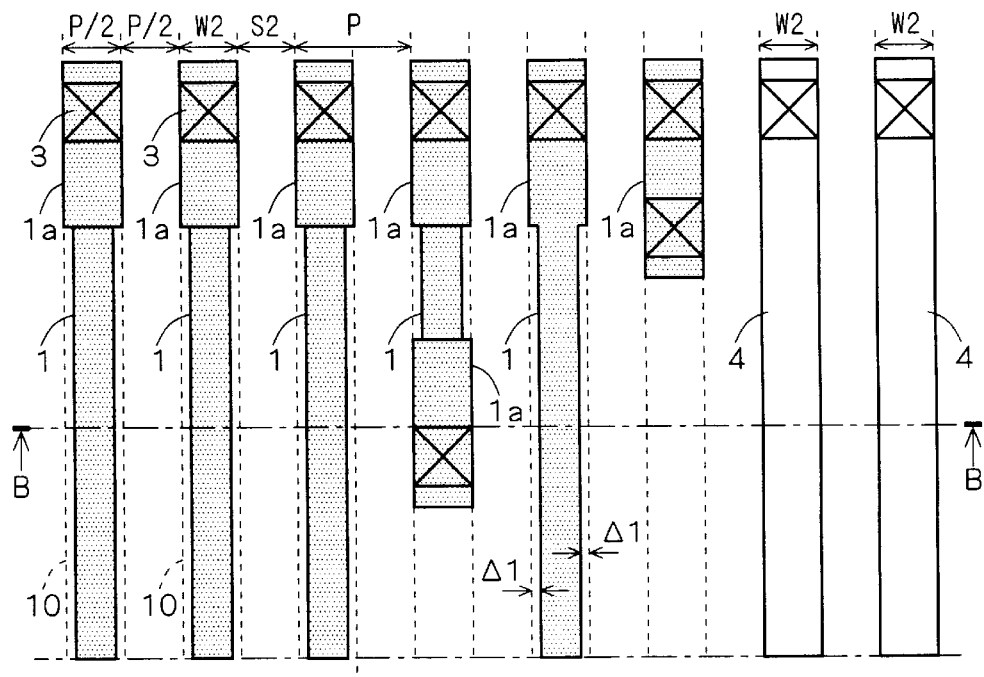

WIRING STRUCTURE FOR AN INTEGRATED CIRCUIT

BACKGROUND OF THE INVENTION

1. Field of the Invention

The present invention relates to a wiring structure of an integrated circuit which takes into account a resistance and a capacitance associated with an electric wire in the wiring structure.

2. Description of the Background Art

Wiring of an integrated circuit is broadly divided into two categories: (1) signal wiring for transmitting a signal or a clock; and (2) ground/power-supply wiring for providing a power supply potential or a ground potential.

For (1) the signal wiring, it is important to reduce a delay time in signal transmission, which requires reduction of an RC delay time obtained based on a product of a wire resistance R and a wire capacitance C.

On the other hand, for (2) the ground/power-supply wiring, it is important to reduce an IR drop of a (power-supply/ground) voltage, and thus it is preferable to reduce a wire resistance R, as generally known.

In most cases, signal wiring is accomplished using a wire width W and a wiring space S which fit in a minimum wiring pitch defined for each wiring layer, in order to increase a wiring density.

FIG. 16 is a plan view of a conventional wiring structure of an integrated circuit. As shown therein, a plurality of signal wires 21 and a plurality of ground/power wires 22, each of which has a wire width W5, are arranged, and a wiring space S5 is provided between every two adjacent wires. Further, via holes 3 are provided at respective predetermined portions in the wires 21 and 22. The signal wires 21 and the ground/power wires 22 are electrically connected with another wiring layer (not shown) located thereunder, through the via holes 3.

A sum of a minimum wire width W and a minimum wiring space S corresponds to, and is referred to as, a minimum wiring pitch P of a wiring layer having the foregoing wiring structure. According to the conventional wiring structure, a wire width W and a wiring space S are determined to be substantially identical to each other, so that the wire width W5 is determined to be approximately 50% of a wiring pitch. To achieve the minimum wiring pitch P, the wire width W5 and the wiring space S5 are determined as W5=S5=P/2, which is illustrated in FIG. 16.

FIG. 17 is a sectional view schematically showing a section of the structure of FIG. 16 taken along a line C—C of FIG. 16. As shown therein, each of the signal wires 21 and the ground/power wires 22 has a wire thickness T5 as a wire thickness T. The wire thickness T5 is determined so as to keep an aspect ratio (T5/W5) which is a ratio of the wire thickness T5 to the wire width W5 of the signal wires 21 and the ground/power wires 22 smaller, than 2, for the reasons discussed below.

A wire resistance R of an electric wire having a wire width W is given by $\{R=\rho \cdot L/(W \cdot T)\}$ wherein $\rho$ represents a resistivity of a wire material and L represents a wire length. On the other hand, an inter-wire capacitance (coupling capacitance) provided between two electric wires which are arranged adjacent to each other with a wiring space S therebetween is approximated by $\{Cc=\in \cdot T \cdot L\}$ wherein $\in$ represents a dielectric constant of an interlayer insulating film.

For the purpose of reducing a resistance, which is required in ground/power-supply wiring, increase of a wire width W is effective as expected from the above-noted equation for the wire resistance R. However, increase of a wire width W has a non-negligible disadvantage of inviting decrease of wiring density.

Then, as an alternative to increase of a wire width W, increase of a wire thickness T is effective in reducing a resistance of an electric wire. Japanese Patent Application Laid-Open No. 11-274154 has paid a particular attention to that procedure, and discloses a wiring method in which a wire thickness T of each signal wire and a wire thickness T of each ground/power wire are made different from each other.

FIGS. 18 to 20 are sectional views for showing the wiring method disclosed in the above-identified reference. More particularly, those figures illustrate a method of forming second metal wires to be electrically connected with first metal wires 300 disposed within a silicon dioxide film ($SiO_2$ film) 301 on a silicon substrate 200 in which a device such as a MOS transistor is to be formed. The first metal wires 300 are electrically connected to a source/drain region, a gate electrode and the like of the MOS transistor.

In accordance with the method disclosed in the above-identified reference, firstly, a silicon nitride film 302, a silicon dioxide film 303, a silicon nitride film 304, a silicon dioxide film 305 and a silicon nitride film 306 are sequentially deposited in this order on the silicon dioxide film 301, to form a stack of layers. The silicon nitride films 302, 304 and 306 differ from the silicon dioxide films 301, 303 and 305 in etch selectivity in predetermined etching.

Thereafter, a resist pattern 307 is formed on the silicon nitride film 306. The resist pattern 307 includes an opening 311 in a first region A1 (region for formation of signal wires) which is to contain electric wires each having a relatively small thickness. The opening 311 corresponds to a width of a via hole to be formed in each signal wire. The resist pattern 307 further includes an opening 312 in a second region A2 (region for formation of ground/power wires) which is to contain electric wires each having a relatively large thickness. The opening 312 corresponds to a wire width of each ground/power wire. Then, the films 303 to 306 in the stack of layers are etched using the resist pattern 307 as a mask, and the resist pattern 307 is removed.

Next, a resist pattern 308 is formed as shown in FIG. 19. The resist pattern 308 includes an opening 313 which corresponds to a width of each signal wire in the first region A1. The resist pattern 308 further includes an opening 314 which corresponds to a via hole to be formed in each ground/power wire in the second region A2. Then, the films 301 and 302 in the stack of layers are etched using the resist pattern 308 as a mask, and the resist pattern 308 is removed.

Subsequently, Ti/TiN is deposited. Thereafter, aluminum is sputtered, so that the aluminum is buried in the via holes and wiring patterns which are opened in the first region A1 and the second region A2. Then, metals (Ti/TiN and aluminum) except portions thereof buried in trenches for wiring are removed using CMP. As a result, metal wires 309 to be electrically connected to the first metal wires 300 through via holes Via can be formed in the first region A1 and the second region A2.

At that time, each of the metal wires 309 in the first region A1 where the metal wires 309 are to function as signal wires and thus increase of an inter-wire capacitance is a matter of the most serious concern has a reduced thickness as compared with that of the metal wires 309 in the second region A2 where the metal wires 309 are to function as ground/power wires and thus increase of resistance is a matter of the most serious concern. This allows for improvement in performance of an LSI.

However, to provide different wire thicknesses T for the signal wires 21 and the ground/power wires 22 would complicate a manufacturing process. For this and other reasons, significant problems would be produced, and thus the method described above is not suitable for practical use. In other words, it is desirable that the signal wires 21 and the ground/power wires 22 have the same wire thickness T, which eliminates a need of employing a special manufacturing method shown in FIGS. 18 and 20, thereby to allow for reduction in manufacturing cost.

To commonize the wire thicknesses T of the signal wires 21 and the wire thickness T of the ground/power wires 22, in turn, would involve increase of the wire thickness T of the signal wires 21 which are usually formed using the minimum wire width W and the minimum wiring space S for maintaining the minimum wiring pitch P, as well as increase of the wire thickness T of the ground/power wires 22. This causes increase of a coupling capacitance Cc provided between adjacent ones of the signal wires 21. Increase of a coupling capacitance Cc invites degradation of an operation speed or increase in power consumption in a circuit with wiring in a small length of approximately 0.5 mm or smaller.

In addition, increase of a coupling capacitance Cc causes a further disadvantage of canceling a noise margin between the signal wires. As discussed above, increase of the wire thickness T for reduction of resistance causes increase of a coupling capacitance Cc with various significant problems. In view of this, in the conventional wiring structure, an aspect ratio T/W had to be determined to be lower than 2, in order to achieve a trade-off between a resistance and a coupling capacitance.

SUMMARY OF THE INVENTION

It is an object of the present invention to obtain an integrated circuit having a wiring structure which achieve both reduction of a resistance of a ground/power wire and reduction of a wire capacitance of a signal wire without adversely affecting otherwise.

The present invention is intended for an integrated circuit having a wiring structure including a plurality of signal wires and a plurality of ground/power wires which maintain a predetermined minimum wiring pitch. In the integrated circuit includes, a ratio of a wiring space between main parts other than via-hole neighboring regions of every two adjacent ones of the plurality of signal wires to the predetermined minimum wiring space is equal to, or higher than, 0.6. Further, the plurality of signal wires and the plurality of ground/power wires have a same wire thickness which allows an aspect ratio which is a ratio of the wire thickness to a minimum wire width of the signal wires, to be equal to, or higher than, 2.

In the wiring structure of the integrated circuit, a ratio of a wiring space between the main parts other than the via-hole neighboring regions of every two adjacent ones of the plurality of signal wires to the minimum wiring pitch is equal to, or higher than, 0.6. Therefore, even if the wiring structure is formed using a wire width and a wiring space which maintain the minimum wiring pitch to increase the wiring density, an effect of reducing an inter-wire capacitance in the plurality of signal wires can be produced because of employment of a larger wiring space than that obtained in a situation where the ratio is approximately 0.5.

Also, the wire thickness is determined to be relatively large so as to allow the aspect ratio of each of the signal wires is equal to, or higher than, 2. This provides for reduction of a wire resistance of each of the plurality of signal wires and the plurality of ground/power wires.

At that time, by the effect of reducing an inter-wire capacitance, increase of inter-wire capacitance which is likely to occur due to the increase of wire thickness can be effectively prevented. Therefore, it is possible to obtain a sufficiently reduced wire capacitance for the signal wires which is composed mainly of the inter-wire capacitance.

Consequently, the wiring structure of an integrated circuit according to the first aspect of the present invention allows for both reduction of a resistance of a ground/power wire and reduction of a wire capacitance of a signal wire without adversely affecting the other elements including the via holes.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 illustrates a result of an ordinary wire layout process.

FIG. 9 is a plan view illustrating a wiring structure of an integrated circuit according to a second preferred embodiment of the present invention.

DESCRIPTION OF THE PREFERRED EMBODIMENTS

Preferred Embodiments

First Preferred Embodiment

Figure 1:
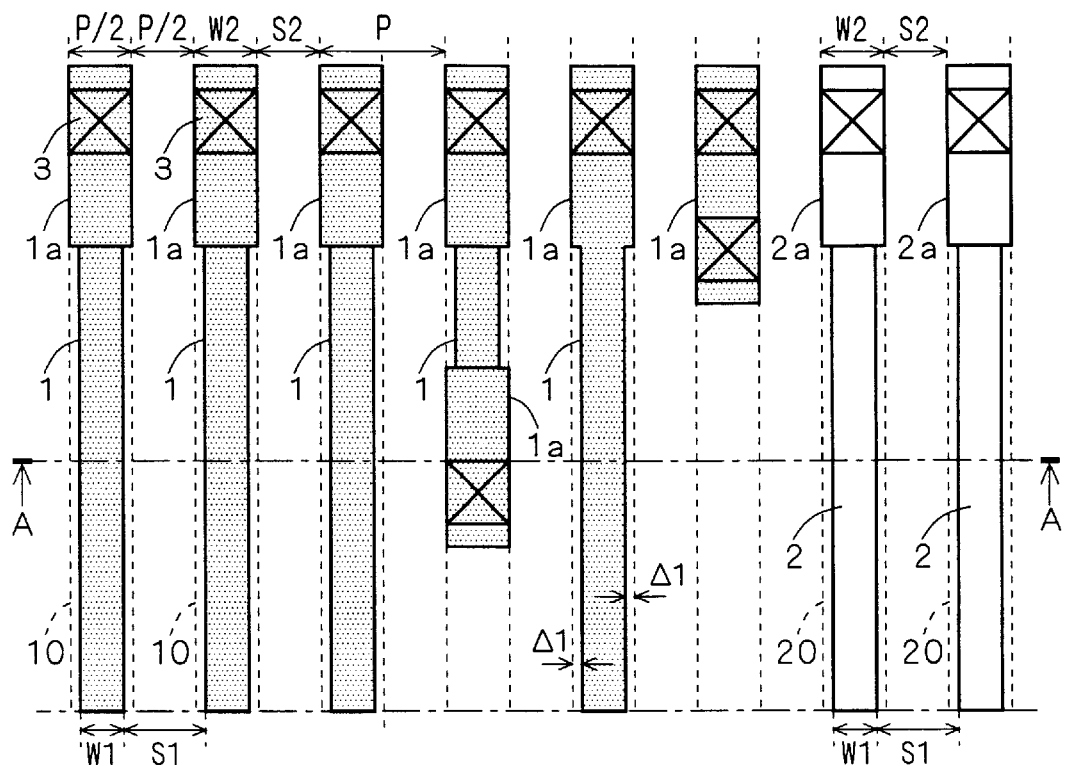
FIG. 1 is a plan view illustrating a wiring structure of an integrated circuit according to a first preferred embodiment of the present invention.
Figure 2:
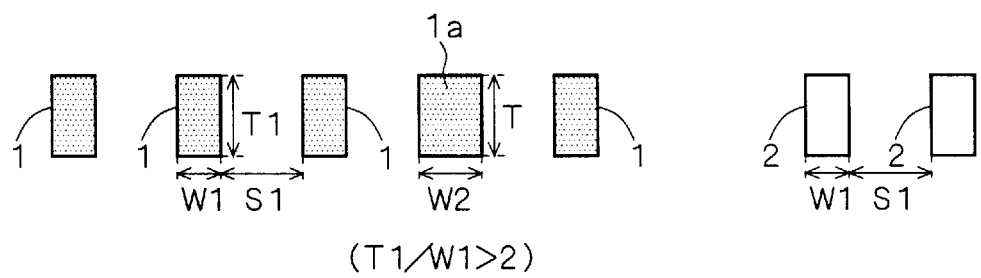
FIG. 2 is a sectional view schematically showing a section of the structure of FIG. 1 taken along a line A—A of FIG. 1.

FIG. 1 is a plan view illustrating a wiring structure of an integrated circuit according to a first preferred embodiment of the present invention. FIG. 2 is a sectional view schematically showing a section of the structure of FIG. 1 taken along a line A—A of FIG. 1.

Referring to FIGS. 1 and 2, a plurality of signal wires 1 and a plurality of ground/power wires 2 are arranged. A wire width W of a main part, other than a via-hole neighboring region 1a, of each of the signal wires 1 is determined to be a wire width W1, and a wiring space S between the main parts of every two adjacent ones of the signal wires 1 is determined to be a wiring space S1. A wire width W of the via-hole neighboring region 1a of each of the signal wires 1 is determined to be a wire width W2 larger than W1, and a wiring space S between the via-hole neighboring regions 1a of every two adjacent ones of the signal wires 1 is determined to be a wiring space S2 smaller than S1. In an analogous manner thereto, a wire width W of a main part, other than a via-hole neighboring region 2a, of each of the ground/power wires 2 is determined to be the wire width W1, and a wiring space S between the main parts of every two adjacent ones of the ground/power wires 2 is determined to be the wiring space S1. A wire width W of the via-hole neighboring region 2a of each of the ground/power wires 2 is determined to be the wire width W2, and a wiring space S between the via-hole neighboring regions 2a of every two adjacent ones of the ground/power wires 2 is determined to be the wiring space S2. The via-hole neighboring region 1a is a region extending over a predetermined distance from a via hole 3 in each of the signal wires 1, and the via-hole neighboring region 2a is a region extending over a predetermined distance from a via hole 3 in each of the ground/power wires 2. The signal wires 1 and the ground/power wires 2 are electrically connected with another wiring layer (not shown) located thereunder, through the via holes 3.

The wire widths W1 and W2 and the wiring spaces S1 and S2 are determined so as to maintain a minimum wiring pitch P, which is expressed as P=W1+S1=W2+S2. Accordingly, the wire width W1 is a minimum wire width and the wiring space S2 is a minimum wiring space in the integrated circuit according to the present preferred embodiment.

Also, the wire width W1 and the wiring space S1 are determined so as to satisfy $\{S1/P \geqq 0.6\}$, and a wire thickness T1 is determined so as to allow an aspect ratio (T1/W1) to be equal to, or lower than, 2.

On the other hand, the wire width W2 and the wiring space S2 in the via-hole neighboring regions 1a and 2a of the signal wires 1 and the ground/power wires 2 are determined to be equal to each other in the same manner as in the conventional wiring structure.

Figure 16:
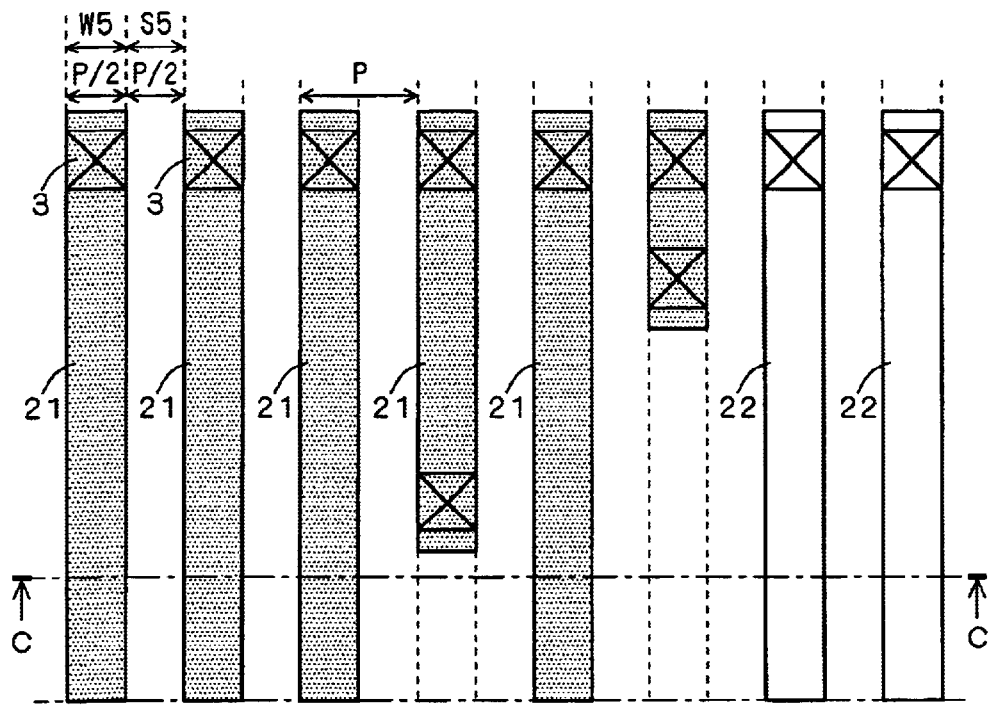
FIG. 16 is a plan view illustrating a conventional wiring structure of an integrated circuit.
Figure 17:
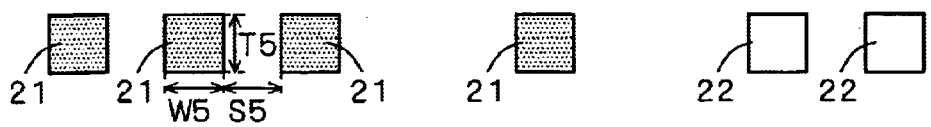
FIG. 17 is a sectional view schematically showing a section of the structure of FIG. 16 taken along a line D—D of FIG. 16.
Figure 18:
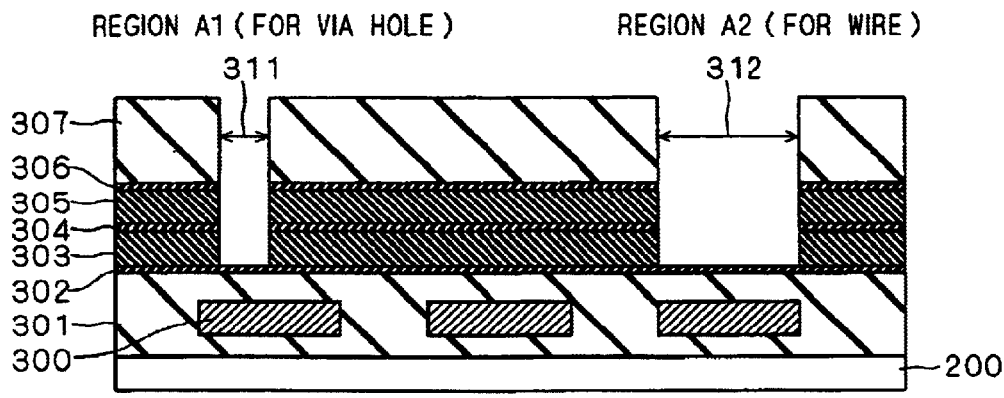
FIG. 18 through FIG. 20 are sectional views for showing a conventional wiring method.
Figure 19:
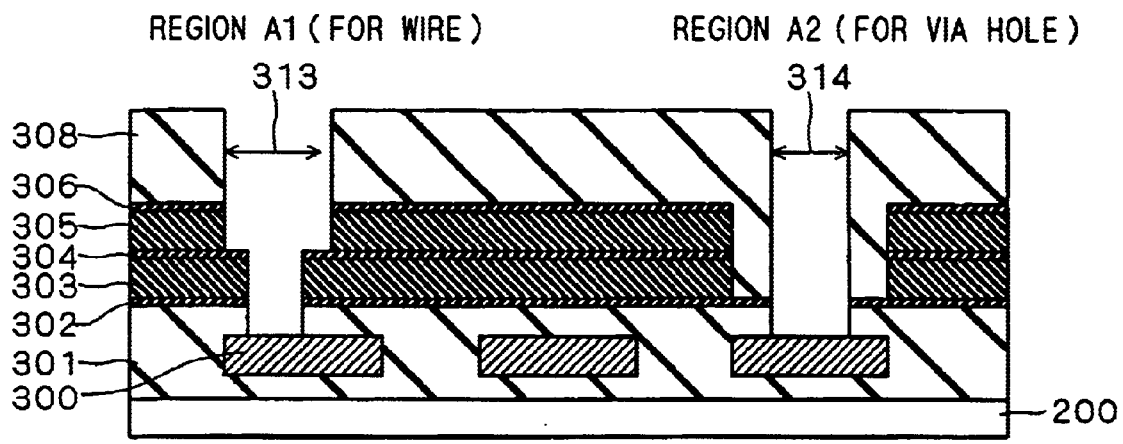
Figure 20:
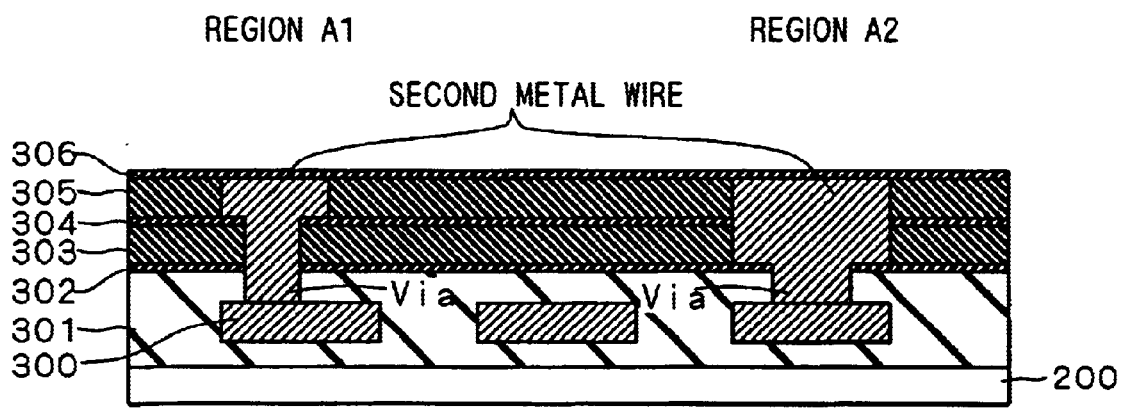

Below, advantages produced by the wiring structure according to the first preferred embodiment will be discussed, with reference to some instances. At the outset, as one example of the conventional wiring structure shown in FIGS. 16 and 17, it is assumed that the minimum wiring pitch P is 800 nm; the wire width W5 is 400 nm; the wiring space S5 is 400 nm; and the wire thickness T5 is 640 nm (this means that an aspect ratio (T5/W5) is 1.6).

In comparison with the above-noted example of the conventional wiring structure, as one example of the wiring structure according to the first preferred embodiment, it is assumed that the minimum wiring pitch P is 800 nm, and the wire width W1 and the wiring space S1 are determined to be 300 nm and 500 nm, respectively, so that S1/P is 0.625 larger than 0.6. The wire width W2 and the wiring space S2 are identical to the wire width W5 and the wiring space S5, respectively.

Figure 3:
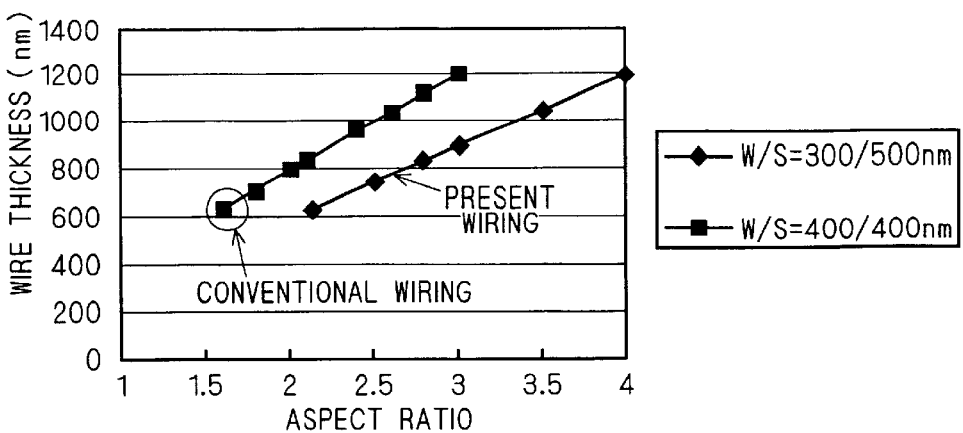
FIG. 3 is a graph indicating a relationship between an aspect ratio and a wire thickness T in each of a conventional wiring structure and the wiring structure according to the first preferred embodiment.
Figure 4:
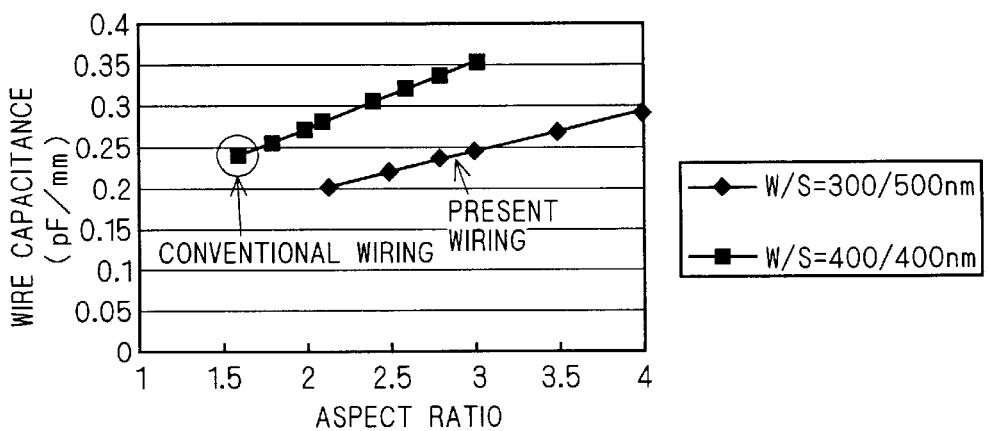
FIG. 4 is a graph indicating a relationship between an aspect ratio and a wire capacitance C in each of the conventional wiring structure and the wiring structure according to the first preferred embodiment.
Figure 5:
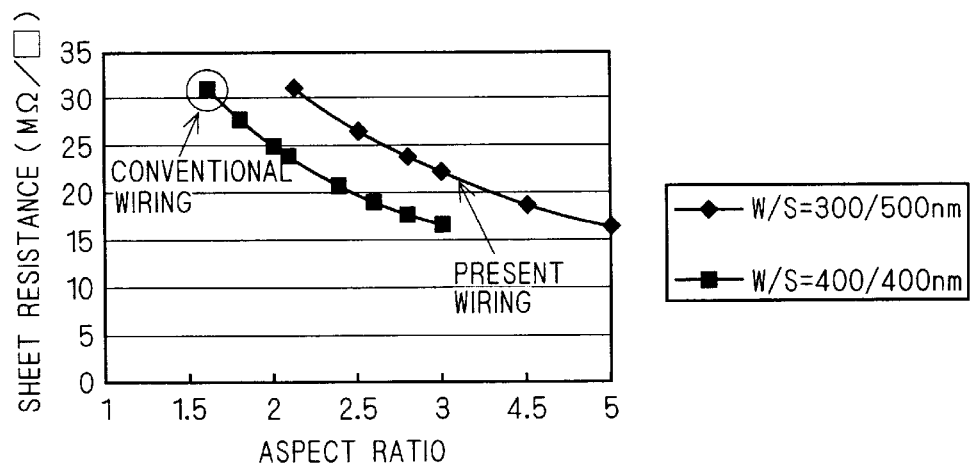
FIG. 5 is a graph indicating a relationship between an aspect ratio and a sheet resistance of an electric wire in each of the conventional wiring structure and the wiring structure according to the first preferred embodiment.
Figure 6:
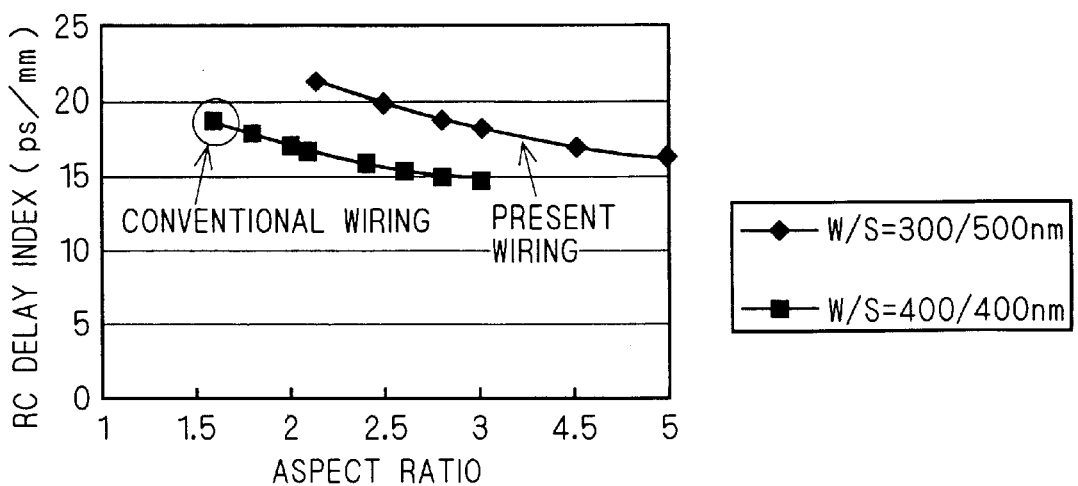
FIG. 6 is a graph indicating a relationship between an aspect ratio and an RC delay time in each of the conventional wiring structure and the wiring structure according to the first preferred embodiment.

FIG. 3 is a graph indicating a relationship between an aspect ratio and a wire thickness T in each of the conventional wiring structure and the wiring structure according to the present preferred embodiment. FIG. 4 is a graph likewise indicating a relationship between an aspect ratio and a wire capacitance C in each of the two wiring structures noted above. FIG. 5 is a graph likewise indicating a relationship between an aspect ratio and a sheet resistance of an electric wire in each of the two wiring structures noted above. FIG. 6 is a graph indicating a relationship between an aspect ratio and an index of RC delay time in each of the two wiring structures noted above.

It is noted that a wire capacitance C in the graphs of FIGS. 3 to 6 is obtained by calculating a wire capacitance of a central one out of three electric wires arranged adjacent to one another with the minimum wiring space (S5, S1) being provided therebetween. For the calculation of the wire capacitance, "4.2" which is considered to be an average dielectric constant of a normal silicon dioxide film is used as a dielectric constant of an interlayer insulating film, and a thickness of the interlayer insulating film interposed between wiring layers (corresponding to the depth of the via hole) is determined to be 640 nm.

As indicated in FIG. 4, a wire capacitance C under the conditions in the above-noted example of the conventional wiring structure is 0.24 PF/mm. Given the conventional wiring structure described above, to increase the wire thickness T5 and thus the aspect ratio would invite increase of a wire capacitance C as appreciated from FIG. 4, while allowing for reduction of a sheet resistance of an electric wire as appreciated from FIG. 5. The increase of a wire capacitance C results in increasing a capacitance to be charged of a transistor which is to be driven ON. This causes a problem of inviting increase of circuit switching delay or increase of power consumption in a circuit with wiring in a small length, as discussed in the Background section of the present specification. Further, as the increase of a wire capacitance C in the conventional wiring structure is caused mainly by increase of a coupling capacitance Cc between adjacent electric wires (inter-wire capacitance), there is produced a further problem of inviting increase of coupling noise. As such, in the conventional wiring structure, increase of aspect ratio would result in the problem of inviting increase of wire capacitance which is so significant as to overwhelm the advantage of reducing a resistance also produced by increase of aspect ratio. Accordingly, wiring with an aspect ratio exceeding 2 has been impossible, conventionally.

In contrast, in the wiring structure according to the present preferred embodiment, the wiring space S1 which is determined so as to be a little over 60 percent of the minimum wiring pitch P is employed. Hence, a coupling capacitance Cc between the plurality of signal wires 1 is reduced as compared with that obtained when only the wiring space S2 which is a little over 50 percent of the minimum wiring pitch P is employed.

As a result, the wiring structure according to the present preferred embodiment makes it possible to keep a wire capacitance C equal to, or smaller than, that in the conventional wiring structure, even if the aspect ratio is determined so as to be relatively high in a range between 2.1 and 3.0. The effect of reducing a coupling capacitance Cc produced by employment of the wiring space S1 as noted above suppresses increase of inter-wire capacitance which is likely to occur when the aspect ratio is determined to be relatively large in a range between 2.1 and 3.0. Thus, increase of a wire capacitance C of the signal wires 1 and the ground/power wires 2 (the signal wires 1 in particular), which occurs and produces the various significant problems in the conventional wiring structure, will not occur in the wiring structure according to the present preferred embodiment.

Further, as appreciated from FIG. 5, in the wiring structure according to the present preferred embodiment, a sheet resistance of an electric wire which is smaller than that obtained in the conventional wiring structure when the aspect ratio is 1.6 can be obtained. As a result, reduction of resistance in the signal wires 1 and the ground/power wires 2 can be achieved. Reduction of resistance is strongly demanded, and thus is highly advantageous, especially for the ground/power wires 2.

Moreover, as appreciated from FIG. 6, the wire width W1 in the wiring structure according to the present preferred embodiment is smaller than the wire width W5 in the conventional wiring structure. This permits an index of RC delay time of an electric wire (RC delay time per unit length (mm)) in the wiring structure according to the present preferred embodiment to be smaller on average than that in the conventional wiring structure. However, by limiting the aspect ratio to approximately 3.0 in the wiring structure according to the present preferred embodiment, an index of RC delay time with the substantially same value of that obtained in the conventional wiring structure when the aspect ratio is 1.6 can be ensured.

As discussed above, the wiring structure according to the present preferred embodiment makes it possible to achieve both reduction of a resistance of a ground/power wire and reduction of a wire capacitance of a signal wire without adversely affecting otherwise.

Furthermore, in the wiring structure according to the present preferred embodiment, the aspect ratio is not necessarily determined to be relatively large up to 3.0. In particular, in a case where an RC delay time serves as a rate-determiner in a wiring structure in a great length exceeding several mm, mostly a minimum wiring pitch is not used. In this situation, by controlling such that the effect of reducing a sheet resistance is more prominent, it is possible to determine an index of RC delay time to be smaller than that in the conventional wiring structure. In any case, by appropriately determining the aspect ratio above the lower limit of 2 (inclusive) depending on a specific desired performance for each device, it is possible to achieve both reduction of a resistance of a ground/power wire and reduction of a wire capacitance of a signal wire without adversely affecting otherwise.

Figure 7:
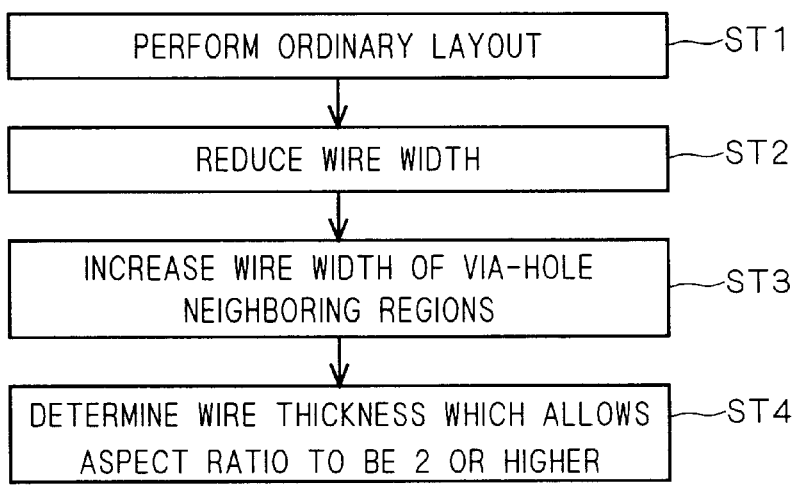
FIG. 7 is a flow chart illustrating a method of designing an integrated circuit according to the first preferred embodiment of the present invention.

FIG. 7 is a flow chart illustrating a method of designing an integrated circuit according to the first preferred embodiment of the present invention. FIG. 8 illustrates a result of an ordinary wire layout process. Below, a process sequence of the method of designing an integrated circuit will be described with reference to FIGS. 7 and 8.

First, in a step ST1, an ordinary wire layout process is performed. The ordinary wire layout process includes arranging virtual signal wires 10 and virtual ground/power wires 20 on layout such that each of the wires has the wire width W2 (=P/2) and the wiring space S2 (=P/2) is provided between adjacent ones of the wires when the minimum wiring pitch is P.

Next, in a step ST2, a wire-width reducing process is performed, in which the wire width of each of the virtual signal wires 10 and the virtual ground/power wires 20 is reduced by a reduction width $\Delta 1$ at opposite sides thereof. The reduction width $\Delta 1$ is ideally equal to, or greater than, 5% of the minimum wiring pitch P. In an situation defined as above, the reduction width $\Delta 1$ is 50 nm Thereafter, in a step ST3, a reserved region for formation of a via hole is searched out, to determine a region extending over a predetermined distance from the via hole in each of the virtual signal wires 10 and the virtual ground/power wires, as the via-hole neighboring region. Subsequently, a wire-width increasing process is performed, in which the wire width of the via-hole neighboring region of each of the virtual signal wires 10 and the virtual ground/power wires 20 is increased by an increase width $\Delta 1$ at opposite sides thereof. As such, the wire width of the via-hole neighboring region of each of the virtual signal wires 10 and the virtual ground/power wires 20 is once reduced and returned back to the wire width W2 as provided in the step ST1.

Then, in a step ST4, the wire thickness T1 is determined so as to allow the aspect ratio to be equal to, or higher than, 2 as shown in FIG. 2.

The virtual signal wires 10 and the virtual ground/power wires 20 resulting from the steps ST1 through ST4 are determined as the signal wires 1 and the ground/power wires 2, respectively. Accordingly, a wiring structure in which the wire width W and the wiring space S in the main parts of the signal wires 10 and the ground/power wires 20 are the wire width W1 and the wiring space S1, respectively, while the wire width W and the wiring space S in the via-hole neighboring regions 1a and 2a of the signal wires 10 and the ground/power wires 20 are the wire width W2 and the wiring space S2, respectively, can be designed.

The increase of the wire width W of the via-hole neighboring region 1a or 2a results in lowering the aspect ratio of the region. This correspondingly facilitates a process for forming electric wires such as copper wires which could not be easily formed if a trench for wiring has a high aspect ratio. Further, the via holes and the electric wires overlap each other in a sufficiently increased area, which allows for improvement of reliability of the wires with respect to electrical connection using via holes.

Modification to the steps ST2 and ST3 of the method may be made. For example, the method may include a step of appointing every part of each virtual wire as an object on which the wire-width reducing process is to be performed, as the step ST2, and include a step of canceling the wire-width reducing process on each via-hole neighboring region and performing the wire-width reducing process on the other parts than the via-hole neighboring regions of each virtual wire, as the step ST3. The foregoing process sequence can also make it possible to obtain the wiring structure shown in FIGS. 1 and 2.

In accordance with the method of designing an integrated circuit of the first preferred embodiment, the wire-width reducing process of the step ST2 is performed on the signal wires 1 and the ground/power wires 2 in the same manner. Accordingly, each of the ground/power wires 2, as well as each of the signal wires 1, has in part the wire width W1 to maintain the minimum wiring pitch P. Because of the reduction of the wire width of the ground/power wires 2 from the wire width W2 to the wire width W1, the degree of reduction in sheet resistance of the ground/power wires 2 which is accomplished by increase of aspect ratio is reduced. Therefore, in practical applications, an effect of reducing a resistance is not exhibited in the ground/power wires 2 unless the aspect ratio is determined to be equal to, or higher than, approximately 3.

However, generally, the ordinary wire layout process of ST1 provides a wire width W larger than the wire width W2 for some of the ground/power wires 2 functioning as main wires (not shown in FIGS. 1 and 2) in which voltage drop is a matter of the most serious concern. Thus, the reduction of the wire width W by the reduction width Δ1 in the step ST2 does not affect so considerably. Hence, the effect of reducing a wire resistance due to reduction of sheet resistance can be sufficiently exhibited even if the aspect ratio is in a range between 2 and 3.

Second Preferred Embodiment

Figure 10:
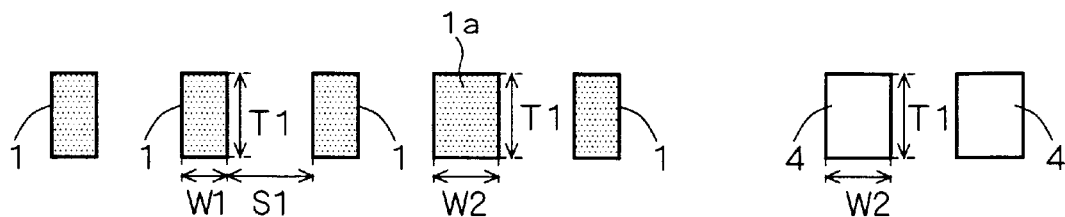
FIG. 10 is a sectional view schematically showing a section of the structure of FIG. 9 taken along a line B—B of FIG. 9.

FIG. 9 is a plan view illustrating a wiring structure of an integrated circuit according to a second preferred embodiment of the present invention. FIG. 10 is a sectional view schematically showing a section of the structure of FIG. 9 taken along a line B—B of FIG. 9.

Referring to FIGS. 9 and 10, the plurality of signal wires 1 and a plurality of ground/power wires 4 are arranged. A wire width W of the main part, other than the via-hole neighboring region 1a, of each of the signal wires 1 is determined to be the wire width W1 (the minimum wire width), and a wiring space S between the main parts of every two adjacent ones of the signal wires 1 is determined to be the wiring space S1. A wire width W of the via-hole neighboring region 1a of each of the signal wires 1 is determined to be the wire width W2 larger than W1, and a wiring space S between the via-hole neighboring regions 1a of every two adjacent ones of the signal wires 1 is determined to be the wiring space S2 smaller than S1. On the other hand, a wire width W of each of the ground/power wires 4 is determined to be the wire width W2, uniformly throughout each entire wire, and a wiring space S of every two adjacent ones of the ground/power wires 4 is determined to be the wiring space S2, likewise uniformly throughout each entire wire.

The wire widths W1 and W2 and the wiring spaces S1 and S2 are determined so as to maintain a minimum wiring pitch P, which is expressed as P=W1+S1=W2+S2. The wire width W1 (the minimum wire width) and the wiring space S1 are determined so as to satisfy {S1/P≧0.6}, in the same manner as in the first preferred embodiment. Further, a wire thickness T1 is determined so as to allow the aspect ratio (T1/W1) to be equal to, or higher than, 2.

In the foregoing wiring structure according to the second preferred embodiment, each of the ground/power wires 4 has a uniform wire width of the wire width W2. As a result, the wiring structure according to the second preferred embodiment produces the same advantages as produced by the wiring structure according to the first preferred embodiment, and in addition, enhances the effect of reducing a resistance in the ground/power wire 4. Though there may be caused increase of a wire capacitance of the ground/power wires 4, such increase produces no problem because the ground/power wires 4 are not adversely affected by increase of a wire capacitance thereof in nature.

Figure 11:
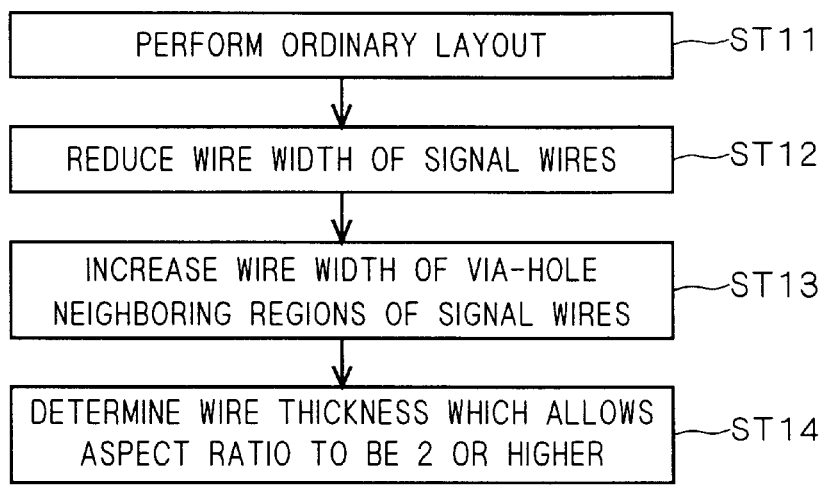
FIG. 11 is a flow chart illustrating a method of designing an integrated circuit according to the second preferred embodiment of the present invention.

FIG. 11 is a flow chart illustrating a method of designing an integrated circuit according to the second preferred embodiment of the present invention. Below, a process sequence of the method of designing an integrated circuit will be described with reference to FIGS. 8 and 11.

First, in a step ST11, an ordinary wire layout process is performed, to obtain the result of the layout process as shown in FIG. 8 in the same manner as in the first preferred embodiment.

Next, in a step ST12, a wire-width reducing process is performed only on the virtual signal wires 10, in which the wire width of each of the virtual signal wires 10 is reduced by the reduction width Δ1 at opposite sides thereof.

Thereafter, in a step ST13, a reserved region for formation of a via hole is searched out, to determine a region extending over a predetermined distance from the via hole in each of the virtual signal wires 10, as the via-hole neighboring region. Subsequently, a wire-width increasing process is performed, in which the wire width of the via-hole neighboring region of each of the virtual signal wires 10 is increased by the increase width Δ1 at opposite sides thereof. As such, the wire width of the via-hole neighboring region of each of the virtual signal wires 10 is once reduced and returned back to the wire width W2 as provided in the step ST11. It is noted that the steps ST12 and ST13 are performed only on the virtual signal wires 10.

Then, in a step ST14, the wire thickness T1 is determined so as to allow the aspect ratio to be equal to, or higher than, 2.

As a result, a wiring structure as shown in FIGS. 9 and 10 can be designed. In the wiring structure shown in the FIGS. 9 and 10; the wire width W and the wiring space S in the main parts of the signal wires 1 are the wire width W1 and the wiring space S1, respectively; the wire width W and the wiring space S in the via-hole neighboring regions 1a of the signal wires 1 are the wire width W2 and the wiring space S2, respectively; the wire width W and the wiring space S in the ground/power wires 4 are respectively uniform at the wire width W2 and the wiring space S2; and each of the signal wires 10 has a wire thickness which allows the aspect ratio to be equal to, or higher than, 2.

Modification to the steps ST2 and ST3 of the method may be made. For example, the method may include a step of appointing every part of each virtual signal wire as an object on which the wire-width reducing process is to be performed, as the step ST2, and include a step of canceling the wire-width reducing process on each via-hole neighboring region and performing the wire-width reducing process on the other parts than the via-hole neighboring regions of each virtual signal wire, as the step ST3. The foregoing process sequence can also make it possible to obtain the wiring structure shown in FIG. 9.

Third Preferred Embodiment

Figure 12:
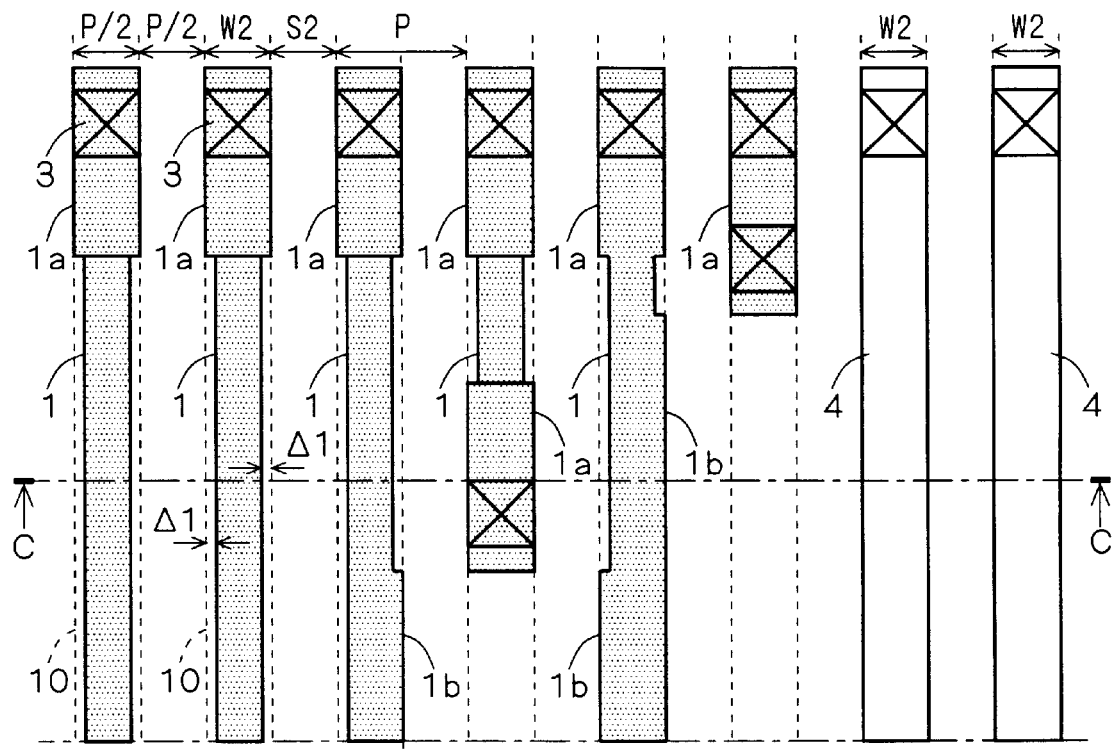
FIG. 12 is a plan view illustrating a wiring structure of an integrated circuit according to a third preferred embodiment of the present invention.
Figure 13:
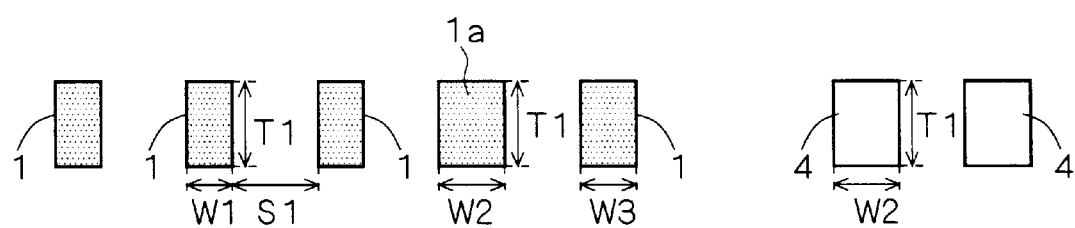
FIG. 13 is a sectional view schematically showing a section of the structure of FIG. 12 taken along a line C—C of FIG. 12.

FIG. 12 is a plan view illustrating a wiring structure of an integrated circuit according to a third preferred embodiment of the present invention. FIG. 13 is a sectional view schematically showing a section of the structure of FIG. 12 taken along a line C—C of FIG. 12.

Referring to FIGS. 12 and 13, the plurality of signal wires 1 and the plurality of ground/power wires 4 are arranged. A wire width W of the main part, other than the via-hole neighboring region 1a and a wiring-space margin side 1b, of each of the signal wires 1 is determined to be the wire width W1, and a wiring space S between the main parts of every two adjacent ones of the signal wires 1 is determined to be the wiring space S1. A wire width W of the via-hole neighboring region 1a of each of the signal wires 1 is determined to be the wire width W2 larger than W1, and a wiring space S between the via-hole neighboring regions 1a of every two adjacent ones of the signal wires 1 is determined to be the wiring space S2 smaller than S1.

The wire widths W1 and W2 and the wiring spaces S1 and S2 are determined so as to maintain a minimum wiring pitch P, which is expressed as P=W+S1=W2+S2. The wire width W1 (the minimum wire width) and the wiring space S1 are determined so as to satisfy {S1/P≧0.6}, in the same manner as in the first preferred embodiment. Further, the wire thickness T1 is determined so as to allow the aspect ratio (T1/W1) to be equal to, or higher than 2.

The wiring-space margin side 1b is at least a region of either of opposite sides of each of the signal wires 1, and is formed by increasing the width of the region by the reduction width Δ1 from the wire width W1. Further, the wiring-space margin side 1b is at least a region of a side of each of the signal wires 1, which region is spaced from another signal wire 1 adjacent thereto with a wiring space S equal to or larger than a predetermined wiring space being provided therebetween. As the wiring space S between the wiring-space margin side 1b and another signal wire 1 adjacent thereto is large enough to dispense with the wire-width reducing process thereon for reducing a wire width by the reduction width Δ1.

Thus, each of the signal wires 1 which has one side including the wiring-space margin side 1b has a wire width W3 (W1+Δ1), and each of the signal wires 1 which has both sides each including the wiring-space margin side 1b has the wire width W2 (W1+2·Δ1). Each of the wire widths W2 and W3 exceeds 0.4P(=W1).

On the other hand, a wire width W of each of the ground/power wires 4 is determined to be the wire width W2, uniformly throughout each entire wire, and a wiring space S of every two adjacent ones of the ground/power wires 4 is determined to be the wiring space S2, likewise uniformly throughout each entire wire, in the same manner as in the second preferred embodiment.

In the foregoing wiring structure of an integrated circuit according to the third preferred embodiment, the wiring-space margin side 1b is included in the signal wires 1, where a ratio of the wire width W2 or W3 to the minimum wiring pitch is equal to, or larger than, 0.4, which is higher than the ratio of the wire width W1 to the minimum wiring pitch P. As a result, the wiring structure according to the third preferred embodiment produces the same advantages as produced by the wiring structure according to the first and second preferred embodiment, and in addition, produces a further advantage of increasing the wire width of the signal wires 1 as a whole, resulting in reduction of resistance of the signal wires 1 as a whole.

Figure 14:
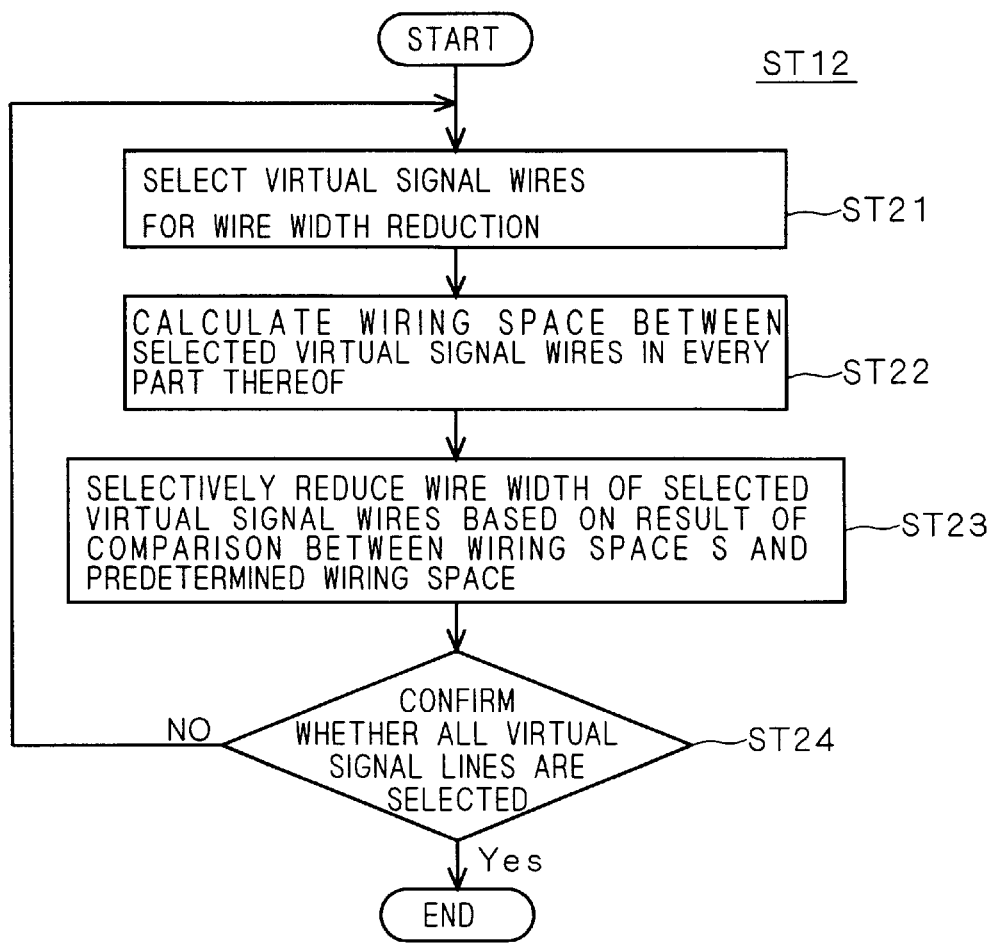
FIG. 14 is a flow chart illustrating a wire-width reducing process on signal wires 1 in a method of designing an integrated circuit according to the third preferred embodiment of the present invention.

FIG. 14 is a flow chart illustrating a wire-width reducing process performed on the signal wires 1 in a method of designing an integrated circuit according to the third preferred embodiment of the present invention. The flow chart of FIG. 14 illustrates processes included in the step ST12 of FIG. 11. The other steps of the method of designing an integrated circuit according to the third preferred embodiment are identical to the steps ST11, ST13 and ST14 illustrated in FIG. 11.

First, in a step ST21, some of the virtual signal wires on which the wire-width reducing process is to be performed are selected as selected virtual signal wires. Subsequently, in a step ST22, a wiring space S between every two adjacent ones of the selected virtual signal wires in every part thereof is calculated.

Then, in a step ST23, a wire-width reducing process is performed on at least a region of each of opposite sides of each selected virtual signal wire, which region is spaced from another virtual signal wire adjacent thereto with a wiring space smaller than the predetermined wiring space being provided. In this process, the wire width of the region is reduced by the reduction width Δ1. The predetermined wiring space may be equal to, or a little over, a half of the minimum wiring pitch P. The wire-width reducing process is not performed on each region in the selected virtual signal wires which is spaced from another virtual signal line adjacent thereto with the predetermined wiring space S or larger being provided.

As a result, at least a region (corresponding to the wiring-space margin side 1b) of each selected virtual signal wire, which region is spaced from another virtual signal wire adjacent thereto with the predetermined wiring space or larger being provided has the wire width W2 or W3, to be over W1 which is equal to 0.4P.

Thereafter, in a step ST24, confirmation is made as to whether all of the virtual signal wires have been selected. If any virtual signal wires remain unselected, such virtual signal wires are newly selected, turning back to the step ST21. If no virtual signal wire remains unselected, all the processes are finished.

The third preferred embodiment describes an example where the selective wire-width reduction performed on the signal wires 1 is incorporated in the method according to the second preferred embodiment. However, alternatively, the selective wire-width reduction performed on the signal wires 1 described in this embodiment may be incorporated in the method according to the first preferred embodiment in an analogous manner.

For the alternative noted above, in the designing method illustrated in FIG. 7, the wire-width reducing process of the step ST2 includes steps identical to those illustrated in FIG. 14 except that the respective processes are performed on not only the virtual signal wires but also the virtual ground/power wires.

Fourth Preferred Embodiment

Figure 15:
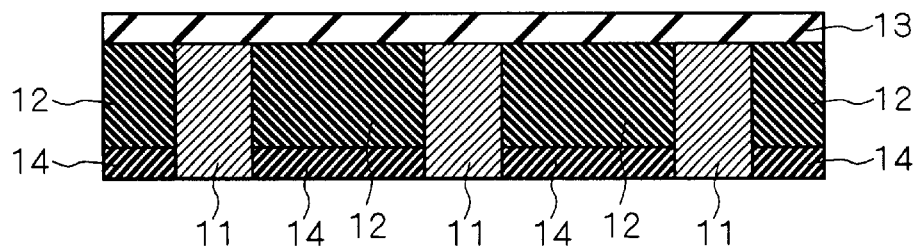
FIG. 15 is a sectional view schematically showing a section of a wiring structure of an integrated circuit according to a fourth preferred embodiment of the present invention.

FIG. 15 is a sectional view schematically showing a section of a wiring structure of an integrated circuit according to a fourth preferred embodiment of the present invention. Referring to FIG. 15, the fourth preferred embodiment employs copper wires 11 as the electric wires (the signal wires 1 and the ground/power wires 2, 4), which are insulatively isolated from one another by a low dielectric constant insulating film 12.

In the structure of the present preferred embodiment, it is necessary to form a copper capping film 13 made of SiN, SiC or the like above the low dielectric constant insulating film 12, as well as form an etch stopper film 14 made of SiO$_2$, SiN, SiC or the like under the low dielectric constant insulating film 12, in order to prevent diffusion of copper.

Hence, because of relatively high dielectric constants of the copper capping film 13 and the etch stopper film 14, the density of electric lines of force is increased though an attempt to reduce a dielectric constant is made by provision of the low dielectric constant insulating film 12. As a result, an effect of reducing a dielectric constant which is produced by provision of the low dielectric constant insulating film 12 is lessened.

Nonetheless, for formation of each of the wiring structure according to the first to third preferred embodiments, processes of increasing a wiring space S are performed even if the minimum wiring pitch P has already been achieved. Accordingly, it is possible to form the low dielectric constant insulating film 12 with a width which is correspondingly increased by the increase of wiring space. Hence, the provision of the low dielectric constant insulating film 12 can produce the effect of reducing a dielectric constant to the maximum extent.

Others

Additionally, for a wire material of the signal wires 1 and the ground/power wires 2 or 4, copper, aluminum, tungsten or the like may be used. For a low-k material, i.e., a material of the low dielectric constant insulating film 12, a silicon dioxide film containing fluorine such as FSG (Fluorinate Silicate Glass) which has a dielectric constant of approximately 3.6, a silicon dioxide film containing carbon such as SiOC which has a dielectric constant of approximately 2.8, an organic polymer having a dielectric constant of approximately 2.8, a porous film containing fluorine or carbon, a porous silicon dioxide film, a porous organic polymer film (each of the above-cited porous materials has a dielectric constant in a range between 1.5 and 2.5) and the like may be formed.

While the invention has been shown and described in detail, the foregoing description is in all aspects illustrative and not restrictive. It is therefore understood that numerous modifications and variations can be devised without departing from the scope of the invention.

What is claimed is:

1. An integrated circuit having a wiring structure including a plurality of signal wires and a plurality of ground/power wires which maintain a predetermined minimum wiring pitch, said signal wires and said plurality of ground/power wires each having main parts and other parts at via-hole neighboring regions, wherein a ratio of a wiring space between said main parts of every two adjacent ones of said plurality of signal wires to said predetermined minimum wiring pitch is equal to, or higher than, 0.6, and said main parts of said plurality of signal wires and said plurality of ground/power wires have a same wire thickness, and said main parts of said plurality of signal wires have an aspect ratio equal to, or higher than, 2, said aspect ratio being a ratio of said wire thickness to a minimum wire width of said wires.

2. The integrated circuit according to claim 1, wherein a ratio of wiring space of said main parts of every two adjacent ones of said plurality of ground/power wires to said minimum wiring pitch is equal to, or higher than, 0.6.

3. The integrated circuit according to claim 1, wherein a wire width of said main part of each of said ground/power wires is greater than said minimum wire width of said signal wires.

4. Integrated circuit according to claim 1, wherein at said main parts each of said plurality of signal wires has a wire width which allows a ratio of said wire width to said minimum wiring pitch to be equal to, or higher than, 0.4, in at least a region thereof which is spaced from another signal wire adjacent thereto with a predetermined wiring space or larger being provided.

5. The integrated circuit according to claim 1, wherein said plurality of signal wires and said plurality of ground/power wires include a plurality of copper wires made of copper, and said integrated circuit further comprises a low dielectric constant insulating film which insulatively isolates said plurality of copper wires and has a dielectric constant lower than that of a silicon dioxide film.

* * * * *